United States Patent [19]

Brady et al.

[11] Patent Number: 5,543,988

[45] Date of Patent: Aug. 6, 1996

[54] HALL SENSOR WITH HIGH SPATIAL RESOLUTION IN TWO DIRECTIONS CONCURRENTLY

[75] Inventors: Michael J. Brady, Brewster; Lia Krusin-Elbaum, Dobbs Ferry; William T. Masselink, White Plains; Padmanabhan Santhanam, Croton-on-Hudson, all of N.Y.; Tsuyoshi Tamegai, Tokyo, Japan

[73] Assignee: International Business Machines Corporation, Armonk, N.Y.

[21] Appl. No.: 479,252

[22] Filed: Jun. 7, 1995

Related U.S. Application Data

[63] Continuation of Ser. No. 55,493, Apr. 30, 1993, abandoned.

[51] Int. Cl.⁶ .............................. G11B 5/37; H01L 29/82; G01R 33/06
[52] U.S. Cl. ..................... 360/112; 257/421; 257/425; 338/32 R; 338/32 H; 324/251
[58] Field of Search ............................ 360/112, 125, 360/126; 257/421–427; 324/251; 307/309, 311; 73/DIG. 3; 338/32 H, 32 R

[56] References Cited

U.S. PATENT DOCUMENTS

| | | | |
|---|---|---|---|
| 3,189,762 | 5/1965 | Galpin | 307/88.5 |
| 3,564,402 | 2/1971 | Pittman | 33/204.4 |
| 3,789,311 | 1/1974 | Masuda | 257/425 |
| 4,186,481 | 2/1980 | Noguchi et al. | 360/112 |
| 4,236,165 | 11/1980 | Kawashima et al. | 257/425 |
| 4,296,424 | 10/1981 | Shibasaki et al. | 338/32 R |

(List continued on next page.)

FOREIGN PATENT DOCUMENTS

| | | | |
|---|---|---|---|
| 56-83832 | 7/1981 | Japan | 360/112 |
| 251723 | 10/1989 | Japan . | |

OTHER PUBLICATIONS

Fluitman; Jul. 1983; "Hall effect device with both voltage leads on one side of the conductor"; The Institute of Physics.

T. Tamegai et al "Direct observation of the critical state field profile in a $YBa_2Cu_3O_{7-y}$ single crystal" Phys. Rev. B, 45, 8201 (1992).

T. Tamegai et al "Spatially resolved magnetic hysteresis in a $YBa_2Cu_3O_{7-y}$ crystal measured by a Hall–probe array", Phys. Rev. B, 4, 2589 (1992).

Y. Sugiyama, "Trends on Recent Development of Semiconductor Magnetic Sensors" Electro Technical Lab Report vol. 54, No. 1, 1990 Suppl. issue.

Y. Sugiyama et al, "Highly–Sensitive Magnetic Sensor Made of AlGaAs/GaAs Heterojunction Semiconductors" Proc. 6th Sensor Symp, 1986 pp. 55–60.

Y. Sugiyama et al, "Highly–Sensitive Split–Contact Magnetoresistor with AlAs/GaAs Superlattice Structure" IEEE Trans. Elec. Devices 36 9 Sep. '89 pp. 1639–1643.

Y. Sugiyama et al, "Highly Sensitive Hall element with Quantum–Well Superlattice Structure" J. Crystal Growth, 95 (1989) 394.

*Primary Examiner*—Jefferson Evans
*Attorney, Agent, or Firm*—Robert M. Trepp

[57] ABSTRACT

A magnetic sensor, memory, and magnetic imager has been described for sensing a magnetic field in two directions concurrently incorporating a bar of semiconductor material having a rectangular cross-section, electrodes for introducing current along the length of the semiconductor material, and electrodes positioned on respective corners of the rectangular cross-section at a common distance along the current path whereby the Hall voltage may be detected concurrently in two directions. The memory includes the above magnetic sensor plus a disk having a magnetic layer thereon for storing information, a positioner for moving the disk, a memory control circuit and a signal processor circuit. The magnetic imager includes a plurality of magnetic field sensors positioned in a one or two-dimensional array. The invention overcomes the problem of mapping magnetic fields with high spatial resolution with high magnetic sensitivity in two directions concurrently.

22 Claims, 4 Drawing Sheets

U.S. PATENT DOCUMENTS

| | | | |
|---|---|---|---|
| 4,315,273 | 2/1982 | Yamamoto et al. | 357/27 |
| 4,371,905 | 2/1983 | Valstyn et al. | 360/112 |
| 4,420,781 | 12/1983 | Sakurai | 360/112 |
| 4,525,671 | 6/1985 | Sansom | 324/249 |
| 4,577,250 | 3/1986 | Sato et al. | 360/112 |
| 4,584,552 | 4/1986 | Suzuki et al. | 338/32 H |
| 4,587,509 | 5/1986 | Pitt et al. | 324/251 |
| 4,622,644 | 11/1986 | Hansen | 364/559 |
| 4,660,018 | 4/1987 | Hatch | 338/32 H |
| 4,667,391 | 5/1987 | Chapuy et al. | 257/421 |
| 4,698,522 | 10/1987 | Larsen et al. | 257/425 |
| 4,760,285 | 7/1988 | Nelson | 307/309 |
| 4,772,929 | 9/1988 | Manchester | 360/112 |
| 4,782,375 | 11/1988 | Popovic | 357/27 |
| 4,828,966 | 5/1989 | Mallary et al. | 360/112 |
| 4,866,854 | 9/1989 | Seltzer | 33/558 |
| 4,987,467 | 1/1991 | Popovic | 357/27 |
| 5,055,820 | 10/1991 | Kimura et al. | 338/32 H |
| 5,057,890 | 10/1991 | Falk et al. | 324/251 |
| 5,068,826 | 11/1991 | Matthews | 365/170 |
| 5,075,247 | 12/1991 | Matthews | 437/52 |
| 5,089,991 | 2/1992 | Matthews | 365/9 |
| 5,093,753 | 3/1992 | Freiderich et al. | 360/112 |
| 5,166,849 | 11/1992 | Fedeli | 360/112 |
| 5,173,758 | 12/1992 | Heremans | 338/32 H |
| 5,257,151 | 10/1993 | Cooper et al. | 360/112 |

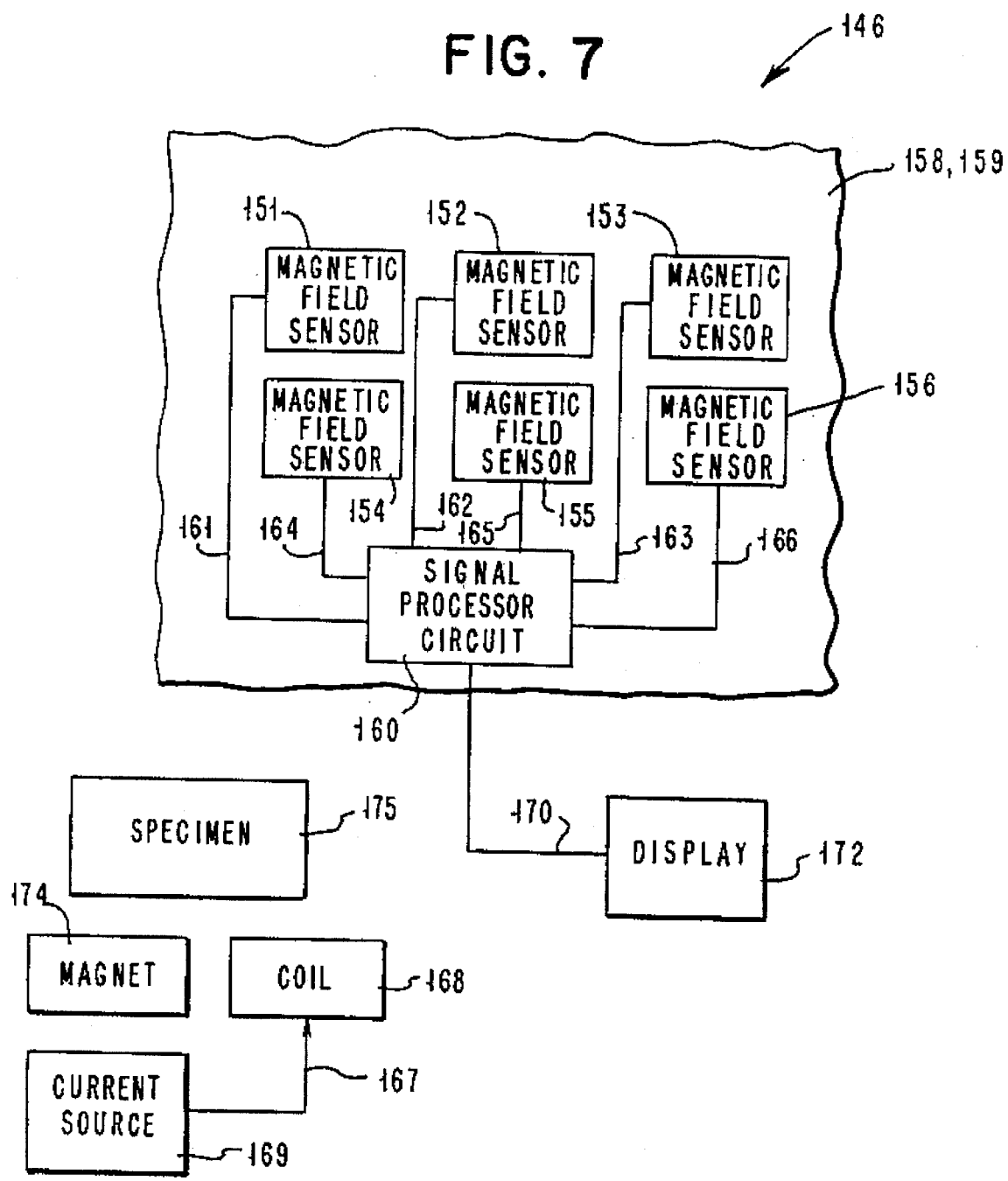

HALL SENSOR WITH HIGH SPATIAL RESOLUTION IN TWO DIRECTIONS CONCURRENTLY

This is a continuation of application Ser. No. 08/055,493, filed Apr. 30, 1993, now abandoned.

BACKGROUND OF THE INVENTION

1. Field of the Invention

This invention relates to magnetic field sensors, a memory and a magnetic imager, and more particularly, to semiconductor Hall devices for simultaneously measuring magnetic fields with high spatial resolution in two directions.

2. Description of the Background Art

A Hall device is normally a four terminal device used for detecting a magnetic field. A semiconductor layer has two electrodes for passing electrical current in a first direction through the layer and two additional electrodes for detecting the voltage transverse to the electrical current at times when a magnetic field to be detected is passing through the semiconductor layer. The voltage on the terminals is known as the Hall voltage and is a measure of the magnetic field component orthogonal to the current passing through the layer.

One example of a Hall element is found in U.S. Pat. No. 5,055,820 which issued on Oct. 8, 1991 wherein several layers or substrates were combined to form a plurality of discrete Hall devices for measuring the magnetic field in several directions at the same time. The Hall devices were spatially distributed, therefore measuring the magnetic field or a component of the magnetic field in one direction at the location of the respective device. A linear array of Hall devices on a GaAs epitaxial film and imaging the critical state of a conventional superconductor Nb has been described in publications by T. Tamegai et al. in Phys. Rev. B, 45, 8201 (1992) and Phys. Rev. B, 4, 2589 (1992).

SUMMARY OF THE INVENTION

In accordance with the invention, an apparatus is described for sensing a magnetic field in two directions concurrently comprising a semi-insulating substrate of a first semiconductor material, first and second spaced apart conductive regions formed in or on the upper surface of the semi-insulating substrate, a layer of insulation formed on the upper surface having a first opening therein between the first and second spaced apart conductive regions, a layer of semiconductive material formed on the layer of insulation wherein the layer is semi-insulating and over the opening wherein the layer is epitaxial and conductive, the layer of semiconductive material being conductive to pass electrical current transverse to the direction between the first and second conductive regions, a first electrode formed on the upper surface of the layer of semiconductor material whereby at times electrical current passes in the layer of semiconductor material, transverse to the direction between the first and second conductive regions, the voltage between the first and second conductive regions is proportional to the magnitude of the magnetic field B passing orthogonal to the electrical current and to the path between the first and second conductive regions and the voltage between one of the first and second conductive regions and the first electrode is proportional to the magnitude of the magnetic field B passing orthogonal to the electrical current and to the path between one of the first and second conductive regions and the first electrode. The layer of semiconductive material formed on the layer of insulation is semi-insulating over the layer of insulation and epitaxial and conductive over the opening exposing the semi-insulating substrate.

BRIEF DESCRIPTION OF THE DRAWINGS

These and other features, objects, and advantages of the present invention will become apparent upon a consideration of the following detailed description of the invention when read in conjunction with the drawing, in which:

FIG. 7 is a second alternate embodiment of the invention.

DESCRIPTION OF THE PREFERRED EMBODIMENT

Figure 1:
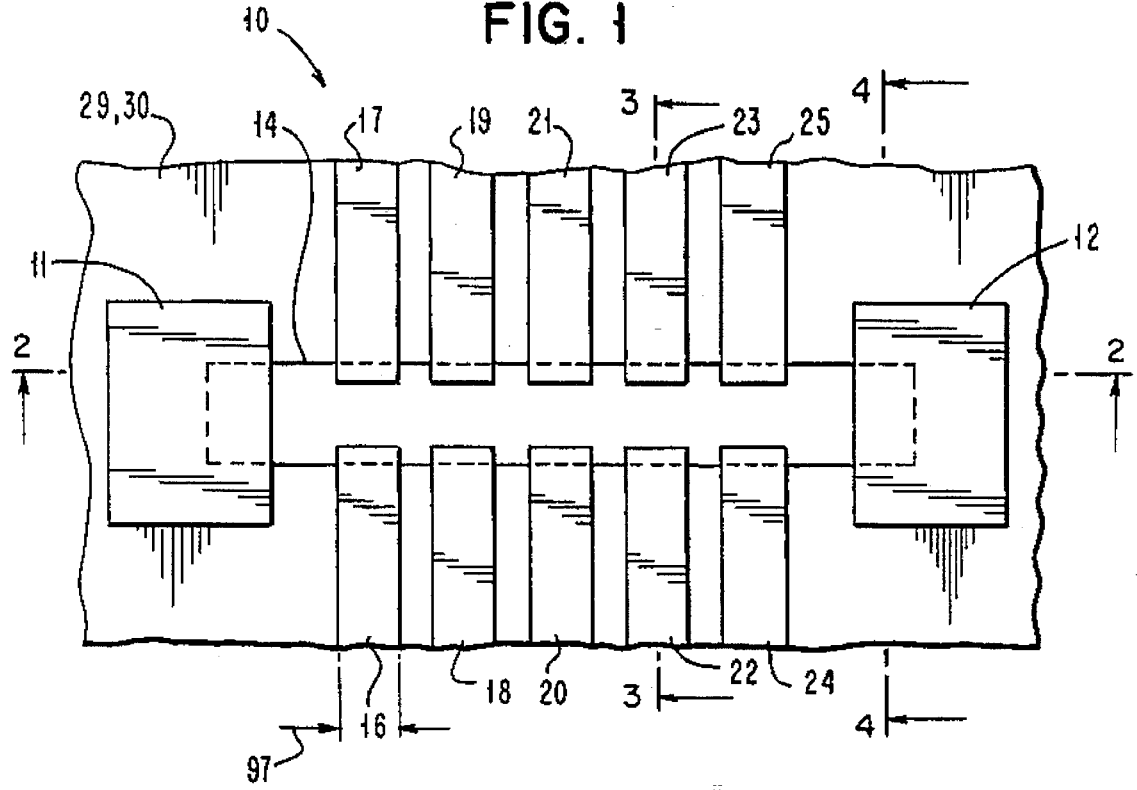
FIG. 1 is a top view of one embodiment of the invention.
Figure 2:
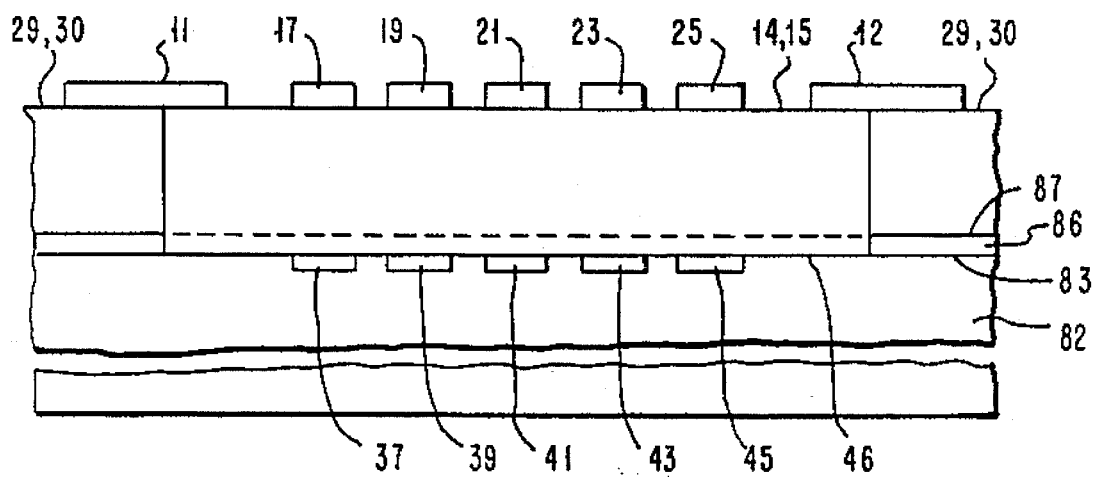
FIG. 2 is a cross-section view along the line 2—2 of FIG. 1.
Figure 3:
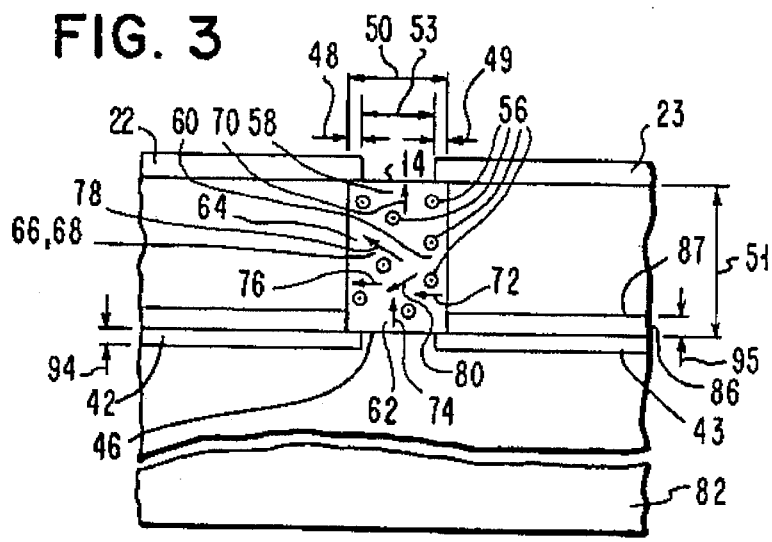
FIG. 3 is a cross-section view along the line 3—3 of FIG. 1.
Figure 4:
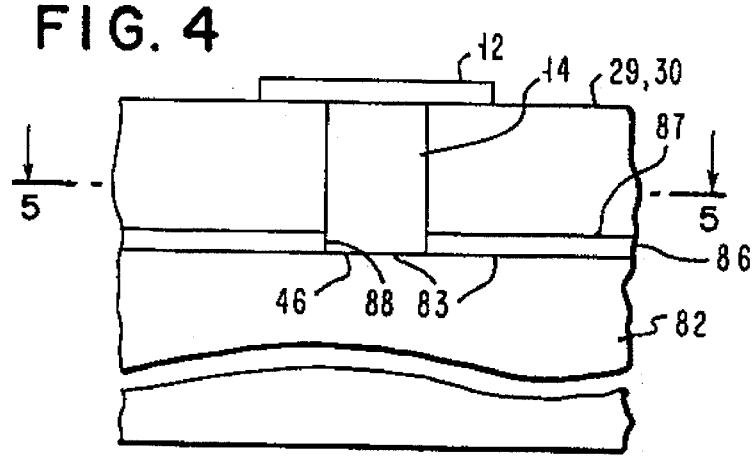
FIG. 4 is a cross-section view along the line 4—4 of FIG. 1.
Figure 5:
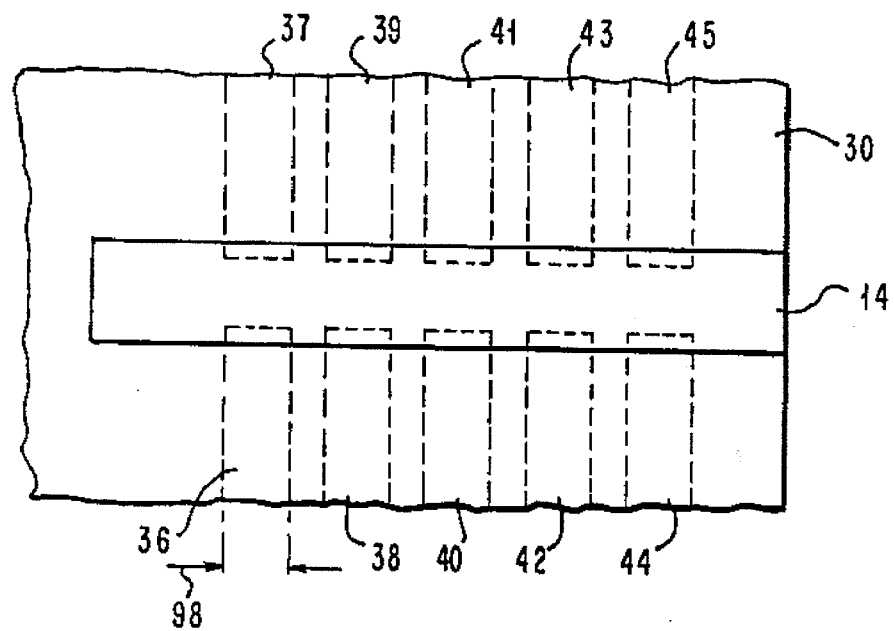
FIG. 5 is a cross-section view along the line 5—5 of FIG. 4.

Referring to the drawing, FIG. 1 shows magnetic field sensor 10 for measuring the magnetic field at specific spatial locations in one or more directions simultaneously. FIGS. 2 through 4 are cross-section views along the respective lines 2—2 through 4—4 of FIG. 1. FIG. 5 is a cross-section view along the line 5—5 of FIG. 4. As shown in FIG. 1, the upper surface 29 of layer 30 has electrodes 11 and 12 for passing current through semiconductor bar 14. Electrodes 11 and 12 are in ohmic contact with semiconductor bar 14 which is a portion of layer 30. Electrodes 16 through 25 are also in ohmic contact with semiconductor bar 14 in the area where the respective electrode overlaps semiconductor bar 14 normally near the edges. Electrodes 11 and 12 and 16 through 25 are formed on upper surface 29 of layer 30 which is semi-insulating except for semiconductor bar 14. Layer 30 may be, for example, GaAs.

FIG. 2 shows electrodes 11 and 12 for passing current through semiconductor bar 14. FIG. 2 shows top electrodes 17, 19, 21, 23 and 25 which make ohmic contact to the upper surface 15 of semiconductor bar 14. Below electrodes 17, 19, 21, 23 and 25 are corresponding electrodes 37, 39, 41, 43 and 45 which are in ohmic contact with lower surface 46 of semiconductor bar 14. Conductive regions 37, 39, 41, 43 and 45 are shown more clearly in FIG. 5. FIG. 5 also shows conductive regions 36, 38, 40, 42 and 44 which are in ohmic contact with lower surface 46 of semiconductor bar 14 and are positioned below corresponding electrodes 16, 18, 20, 22 and 24 shown in FIG. 1. Electrodes 16 through 25 and conductive regions 36 through 45 function to sample the voltage on upper surface 15 or lower surface 46 of semiconductor bar 14. Electrodes 16 through 25 and conductive regions 36 through 45 overlap the upper surface 15 or lower surface 46 of semiconductor bar 14 by about 2 micrometers as shown by arrows 48 and 49 in FIG. 3. The width of semiconductor bar 14 is about 10 micrometers shown by arrow 50 in FIG. 3. The depth of semiconductor bar 14 is about 5,000 Å as shown by arrow 51 in FIG. 3. The spacing between electrodes 22 and 23 or conductive regions 42 and 43 is about 6 micrometers shown by arrow 53 in FIG. 3.

As shown in FIG. 3, with an electrical current 56 passing through semiconductor bar 14, electrodes 22 and 23 form a first Hall device 58, electrode 23 and conductive region 43 form a second Hall device 60, conductive regions 42 and 43 form a third Hall device 62, conductive region 42 and electrode 22 form a fourth Hall device 64, electrode 22 and conductive region 43 forms a fifth Hall device 66 and conductive region 42 and electrode 23 form a sixth Hall device 68. The voltage across Hall device 58 would be a measure of the magnetic field in the direction shown by arrow 70. The voltage across Hall device 60 would be a measure of the magnetic field in the direction shown by arrow 72. The voltage across Hall device 62 would be a measure of the magnetic field in the direction shown by arrow 74. The voltage across Hall device 64 would be a measure of the magnetic field in the direction shown by arrow 76. The voltage across Hall device 66 would be a measure of the magnetic field in the direction shown by arrow 78. The voltage across Hall device 68 would be a measure of the magnetic field in the direction shown by arrow 80. Arrows 70, 72, 74, 76, 78 and 80 may point in the opposite direction or in the direction shown. The Hall voltage $V_H$ is given in equation 1.

$$\vec{V_H} = \frac{1}{ned} \vec{B} \times \vec{I} \quad (1)$$

In equation 1, n is the dopping level, e is the electronic charge, and d is the thickness of semiconducting bar 14 orthogonal to the current and orthogonal to the path between the electrodes measuring the voltage $V_H$, B is the magnetic field component orthogonal to the current and orthogonal to the path between the electrodes measuring the voltage $V_H$, I is the current 56 flowing through semiconductor bar 14. As shown in FIG. 3 by recording the voltages of electrode 22, electrode 23, conductive region 43 and conductive region 42, the Hall voltage for 6 devices may be determined which is a measure of the magnetic field in at least 6 directions shown by arrows 70, 72, 74, 76, 78 and 80 concurrently or simultaneously.

FIG. 4 shows electrode 12 which is in ohmic contact with semiconductor bar 14 for directing electrical current into semiconductor bar 14. The electrical current flows through semiconductor bar 14 and out electrode 11 shown in FIG. 1.

Referring to FIGS. 1 through 5, magnetic field sensor 10 is fabricated by first selecting a semi-insulating substrate 82. Semi-insulating substrate 82 may be GaAs, InSb, InAs, InP, Se, Ge and Si. Substrate 82 has an upper surface 83. A pattern for forming conductive regions 36 through 45 may be lithographically defined such as with photoresist on upper surface 83. Conductive regions 36 through 45 are ion implanted with $1 \times 10^{13} cm^{-2}$ atoms in substrate 82 where substrate 82 is GaAs. The photoresist is subsequently removed from upper surface 83 and the ion implanted regions are annealed to activate the dopant atoms to form conductive regions 36 through 45. A blanket deposit of 50 nm of high-quality plasma-assisted chemical vapor deposited (PACVD) $SiO_2$ is deposited to form layer 86. An opening is lithographically defined such as with photoresist on upper surface 87 of layer 86. Layer 86 is etched using a buffered HF solution, for example, to expose upper surface 83 of substrate 82. The opening 88 will be the base and surface for growth of semiconductor bar 14.

Windows or openings may also be formed through layer 86 to upper surface 83 for electrical connection from conductive regions 36 through 45 respectively through layer 30 to upper surface 29. Conductive regions 36 through 45 may be extended to areas where upper surface 29 is clear of other electrodes for electrical connection through layers 30 and 86 by way of forming windows in layer 86. Layer 30 grown from a window in layer 86 exposing upper surface 83 will form a conductive column from upper surface 83 to upper surface 29. Alternatively, metal may be used to contact conductive regions 36 through 45.

A layer 30 of GaAs doped with Si at $5 \times 10^{17} cm^{-3}$ is grown by molecular beam epitaxy (MBE) in opening 88 on upper surface 83 of semi-insulating substrate 82 and on upper surface 87 of layer 86. Where layer 30 is grown on upper surface 87, layer 30 will be semi-insulating. Where layer 30 is grown over upper surface 83 of substrate 82, the growth will be epitaxial and will be of excellent quality thus forming semiconductor bar 14 at the time of deposition as a portion of layer 30. The upper surface 29 of layer 30 and semiconductor bar 14 is substantially planar even though layer 30 is deposited in opening 88. The formation of an epitaxial semiconductor bar 14 over upper surface 83 and the formation at the same time of a semi-insulating layer 30 over upper surface 87 is a requirement in order to define semiconductor bar 14 through which electrical current flows from electrode 12 through semiconductor bar 14 to electrode 11. Electrodes 11 and 12 and 16 through 25 may be formed by depositing a layer of Pd followed by a layer of Ge and a layer of Au on upper surface 29. Previous to this deposition, the top electrodes may be patterned lithographically with photoresist. The electrodes are patterned by the liftoff of the photoresist after a blanket deposition of Pd, Ge, and Au in any order. A heat treatment step alloys the three layers to alloy together as one layer of Pd/Ge/Au. In addition to GaAs, layer 30 and semiconductor bar 14 may be selected from the group consisting of InSb, InAs, Se, Ge, Si and SiGe. Layer 30 and semiconductor bar 14 may be deposited by an epitaxial technique including molecular beam epitaxy (MBE), metal organic chemical vapor deposition (MOCVD) and liquid phase epitaxy (LPE). A semi-insulating substrate or layer, as used herein, typically means having a resistance in excess of $10^6$ ohm cm.

Referring to FIG. 3, conductive regions 42 and 43 may have a thickness of 1,000 Å as shown by arrow 94. Layer 86 may have a thickness of 500 Å has shown by arrow 95. The width of electrode 16 may be, for example, 50 micrometers as shown by arrow 97 in FIG. 1. The width of conductive region 36 may be, for example, 50 micrometers as shown by arrow 98 in FIG. 5.

Figure 6:
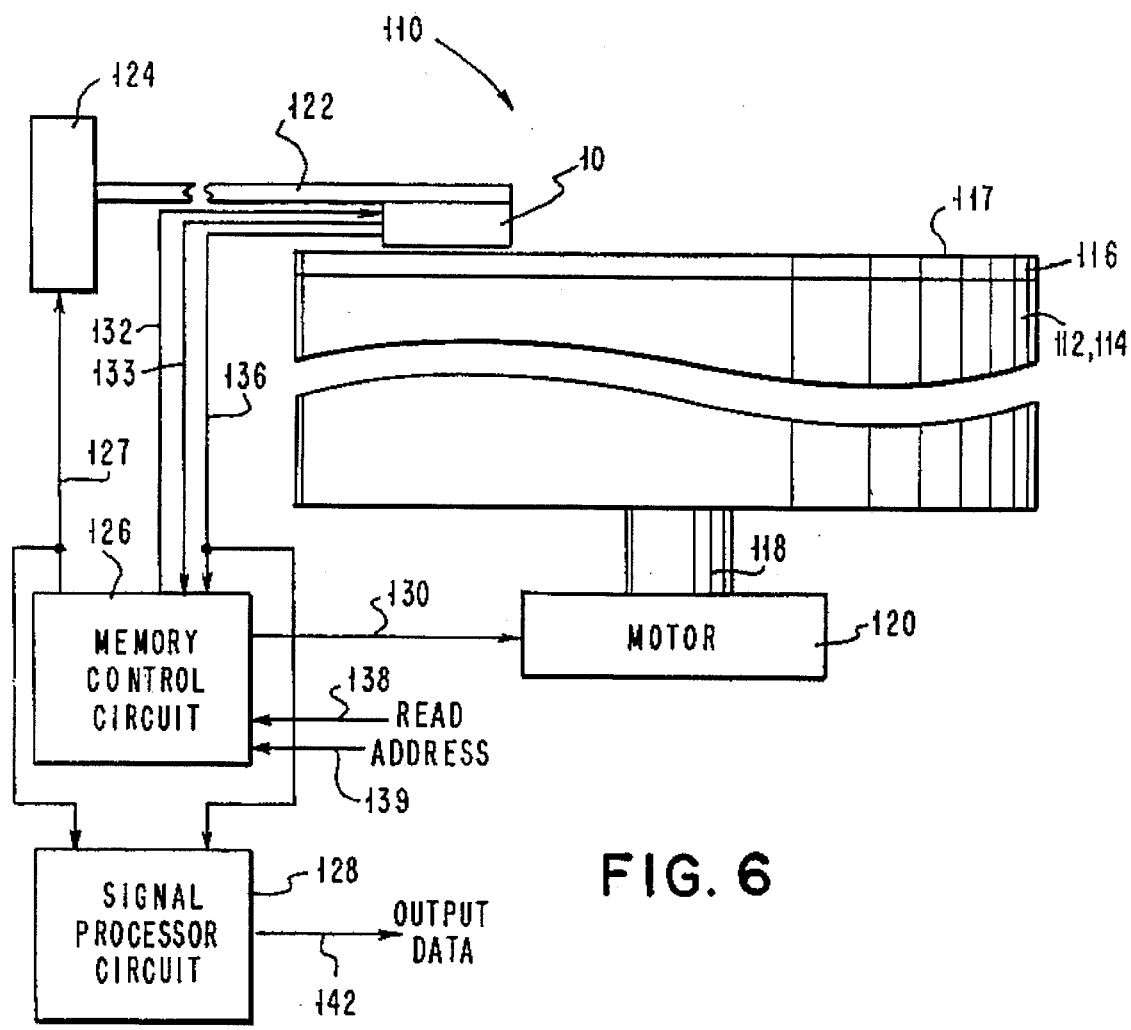
FIG. 6 is a first alternate embodiment of the invention.

Referring to FIG. 6, a memory 110 is shown which may be, for example, a direct access storage device (DASD). A disk 112 is shown having a substrate 114 and a magnetic layer 116 positioned on substrate 114. Disk 112 is supported by spindle 118 which is coupled to motor 120 which functions to rotate spindle 118 and disk 112. Magnetic layer 116 may have data stored therein as a function of the orientation of magnetic fields within magnetic layer 116 and the magnetic field flux return paths directly above upper surface 117. Magnetic field sensor 10 as described in FIG. 1, is positioned face-down in close proximity of upper surface 117 to intercept magnetic fields leaving or entering upper surface 117. Magnetic field sensor 10 is physically supported and positioned by a slider 122 which is controlled by actuator 124. Actuator 124 may be a solenoid.

Memory control circuit 126 functions to generate control signals over lead 127 to a control input of actuator 124 and to an input of signal processor circuit 128. Memory control circuit also provides a control signal over lead 130 to motor 120.

Memory control circuit 126 provides an electrical current over lead 132 to magnetic field sensor 10 and, more specifically, to electrode 12 shown in FIG. 1. Electrode 11 shown in FIG. 1 is coupled over lead 133 to memory control circuit 126 to provide a return path for the current flowing over lead 132. The Hall voltages $H_y$ at one or more conductive regions 36 through 45 and electrodes 16 through 25 are coupled over lead 136 to an input of memory control circuit 126 and to an input of signal processor circuit 128. Lead 136 may be a cable of many leads to accommodate the many voltages being received from magnetic field sensor 10. Memory control circuit 126 functions to retrieve data previously stored in magnetic layer 116 in response to a read signal on lead 138 and an address signal on lead 139. Magnetic field sensor 10 functions to measure the magnetic fields intercepting magnetic field sensor 10 and to provide analog or digital signals, for example, respective Hall voltages from respective Hall devices indicative of the magnetic fields over lead 136 to signal processor circuit 128. Signal processor circuit 128 functions to process the signals received over lead 136 to provide an output signal on lead 142 indicative of the data retrieved from magnetic layer 116.

Signal processor circuit 128 may include an arithmetic unit for performing arithmetic operations such a taking the difference between various signals, taking the average of various signals and determining magnetic field gradients by taking the difference of a plurality of Hall devices along a particular path in magnetic field sensor 10. The output signal on lead 142 would typically be a digital 1 or 0 representing the data stored at a particular location on magnetic layer 116.

Referring to FIG. 7, a magnetic imager 146 is shown for imaging magnetic fields associated with a specimen comprising magnetic field sensors 151 through 156. Magnetic field sensors 151 through 156 may be, for example, magnetic field sensor 10 shown in FIG. 1 or variations thereof which may be individually packaged and placed on a supporting substrate 158. Supporting substrate 158 may include printed circuit wiring for interconnecting magnetic field sensors 151 through 156 to signal processor circuit 160. Signal processor circuit 160 is coupled over leads 161 through 166 to magnetic field sensors 151 through 156 respectively. Leads 161 through 166 may be formed on upper surface 159, for example, or on multilayers on supporting substrate 158. Supporting substrate 158 may be, for example, rigid or flexible depending on its intended use. For example, conformal magnetic imaging may be desired, for example, on or from specimens such as metal parts, human anatomy, animal anatomy, and biological structures. The supporting substrate may be polyimide, a polyester such as polyethylene terephthalate (mylar), polypropylene, fiberglass, glass, ceramic or a woven fabric of threads forming from the aforementioned materials. Supporting substrate 158 may be wrapped around an object to be examined. Substrate 158 may hold a large number of additional magnetic field sensors such as over 1000 in addition to magnetic field sensors 151 through 156 shown in FIG. 7 wherein each sensor may be, for example, a magnetic field sensor 10 shown in FIG. 1 or variations thereof. A rigid printed circuit board may be used for supporting substrate 158 for applications where a fixed array of magnetic field sensors 151 through 156 are desired. Magnetic field sensors 151 through 156 may be used for measuring the magnetization in superconductors, in biological imaging, in medical imaging where the sensors are positioned externally or internally, and in non-destructive testing. Magnetic field sensors 151 though 156 may be used for detecting microcracks and voids in metallurgical surfaces and below. An additional coil 168 and current source 169 couple over lead 167 may provide a magnetic field for inspecting materials. A permanent magnet 174 may be used in place of the coil. Magnetic field sensors 151 through 156 may be used for detecting wiring failures on printed circuit boards and wiring failures on integrated circuit chips. In FIG. 7, specimen 175 is shown as the subject matter to be imaged which may be any of the above mentioned materials or the materials expected for the above mentioned application.

Magnetic field sensors 151 through 156 each may contain a plurality of magnetic field sensors 10 or variations of magnetic field sensor 10 wherein the number of electrodes and conductive regions are increased to provide additional Hall devices and where the semiconductor bar 14 may follow a predetermined path such as a serpentine path or a circular path. In addition, magnetic field sensor 10 may include a plurality of semiconductor bars 14 to provide a 2-dimensional array of semiconductor bars 14 containing Hall devices for measuring the magnetic field at each position in semiconductor bar by Hall devices in at least two directions concurrently.

Signal processor circuit 160 shown in FIG. 7 may process the various voltages received over leads 161 through 166 and perform arithmetic operations on the voltages to determine the sensed magnetic field, the gradient of the magnetic field and the average of the magnetic field as detected by a plurality of Hall devices. The output of signal processor 160 is coupled over lead 170 to display 172 which may provide a representation of the data received on leads 161 through 166 or a representation of arithmetically processed or generated data on display 172.

It is understood that signal processor circuit 160 also provides electrical current for semiconductor bar 14 in each magnetic field sensor 151 through 156.

The invention utilizes MBE growth technology, ion implantation, graded doping, and lithographic processing, to provide a new device capable of measuring magnetic fields in a sub-micron-squared area in two mutually perpendicular directions with excellent sensitivity. The magnetic sensitivity is, for example, 75 V/A/Tesla. By utilizing electron beam lithography, line widths of the disclosed device may be reduced to 0.1 micrometers. By utilizing optical lithography, line widths may be as small as 0.3 micrometers.

An apparatus for sensing a magnetic field in two directions concurrently has been described comprising a bar of semiconductor material having a rectangular cross-section, the bar having spaced apart first and second electrodes with respect to its length for applying a current in the direction of its length, and third, fourth and fifth electrodes spaced apart and positioned on the bar at a common distance intermediate the first and second electrodes and on respective corners of the rectangular cross-section whereby the Hall voltage may be detected concurrently in two directions transverse to the length of the bar of semiconductor material.

A memory has been described comprising a head for retrieving data utilizing the magnetic field sensor of the invention, a slider for supporting the head, a disk having a magnetic layer thereon for storing information and means for positioning the surface of the magnetic layer with respect to the head.

The invention further describes a magnetic imager comprising an array of magnetic field sensors positioned on a substrate which may be flexible or rigid and a signal processor circuit for arithmetically processing the voltages received from the magnetic field sensors and a display for displaying information representative of the magnetic fields at predetermined spatial locations or for displaying magnetic field gradients as a function of predetermined spatial locations. The magnetic imager may be positioned on a flexible substrate for wrapping conformally the magnetic imager on a human and animal body or on a mechanical part or biological specimen.

While there has been described an illustrated an apparatus for sensing a magnetic field in two directions concurrently, a memory utilizing the magnetic sensor, and a magnetic imager utilizing a plurality of the magnetic sensors, it will be apparent to those skilled in the art that modifications and variations are possible without deviating from the broad scope of the invention which shall be limited solely by scope of the claims appended hereto.

Having thus described our invention, what we claim as new and desire to secure by Letters Patents is:

1. An apparatus for sensing a magnetic field in two directions concurrently comprising:

a semi-insulating substrate of a first semiconductor material having an upper surface, first and second spaced apart conductive regions formed in said upper surface of said semi-insulating substrate, a layer of insulation formed on said upper surface of said semi-insulating substrate, said layer of insulation having a first opening therein between and above a portion of said first and second spaced apart conductive regions and exposing said upper surface of said semi-insulating substrate between said first and second conductive regions, a layer of material having an upper and lower surface having a semiconductor region and a semi-insulating region, said lower surface formed on said layer of insulation and in said first opening wherein said layer of material is said semi-insulating region on said layer of insulation and wherein said layer of material is said semiconductor region in and over said first opening, means for passing an electrical current through said semiconductor region of said layer of material in a direction transverse to an axis extending between said first and second conductive regions, a first electrode formed on said upper surface of said semiconductor region of said layer of material whereby at times said electrical current passes in said semiconductor region of said layer of material, the voltage between said first and second conductive regions is proportional to the magnitude of the magnetic field B passing orthogonal to said electrical current and to said axis extending between said first and second conductive regions and the voltage between one of said first and second conductive regions and said first electrode is proportional to the magnitude of the magnetic field B passing orthogonal to said electrical current and to the axis extending between said one of said first and second conductive regions and said first electrode.

2. The apparatus of claim 1 wherein said semi insulating substrate is an alloy of elements selected from Groups III and V of the Periodic Table.

3. The apparatus of claim 1 wherein said first and second spaced apart conductive regions are formed by ion implantation through said upper surface.

4. The apparatus of claim 3 wherein said first and second spaced apart conductive regions include silicon having a concentration in the range from $1 \times 10^{18}$ atoms/cc or greater.

5. The apparatus of claim 1 wherein said layer of material is epitaxial above said portion of said first and second conductive regions and above said exposed semi-insulating substrate.

6. The apparatus of claim 1 wherein said layer of material is an element selected from Group IV of the periodic table or a compound selected from the elements in Groups III and V of the Periodic Table.

7. The apparatus of claim 1 wherein said layer of material is doped with silicon in the range from 1 to $10 \times 10^{17}$ atoms/cc.

8. The apparatus of claim 1 wherein said first and second conductive regions are spaced apart in the range from 5 to 15 microns.

9. The apparatus of claim 1 wherein said layer of insulation includes $SiO_2$.

10. The apparatus of claim 9 wherein said $SiO_2$ is formed by plasma assisted chemical vapor deposition (PACVD).

11. The apparatus of claim 1 wherein said first electrode is formed above one of said first and second conductive regions.

12. The apparatus of claim 11 further including a plurality of first conductive regions, a plurality of second conductive regions and a plurality of respective first electrodes thereover to provide a plurality of two directional sensors of magnetic flux density B.

13. The apparatus of claim 12 wherein said plurality of first conductive regions are spaced apart along a first path.

14. The apparatus of claim 13 wherein said plurality of second conductive regions are spaced apart along a second path.

15. The apparatus of claim 13 wherein said first path forms a straight line.

16. The apparatus of claim 1 further including a second electrode formed on said upper surface of said semiconductor region of said layer of material.

17. The apparatus of claim 1 wherein said upper surface of said layer of material has a layer of insulation thereon for positioning said upper surface in close proximity to a sample to be sensed.

18. The apparatus of claim 1 further including a coating over said layer of material for positioning said surface in close proximity to a moving media of magnetic material.

19. A memory for retrieving data stored in a magnetic layer comprising:

a disk including said magnetic layer thereon, a positioner for moving said disk, a head positioned to intercept magnetic flux emerging or returning to said magnetic layer for generating signals indicative of magnetic fields, said head including a detector for sensing a magnetic field in two directions concurrently comprising:

a semi-insulating substrate of a first semiconductor material having an upper surface, first and second spaced apart conductive regions formed in said upper surface of said semi-insulating substrate, a layer of insulation formed on said upper surface of said semi-insulating substrate, said layer of insulation having a first opening therein between and above a portion of said first and second spaced apart conductive regions and exposing said upper surface of said semi-insulating substrate between said first and second conductive regions, a layer of material having an upper and lower surface having a semiconductor region and a semi-insulating region, said lower surface formed on said layer of insulation and in said first opening wherein said layer of material is said semi-insulating region on said layer of insulation and wherein said layer of material is said semiconductor region in and over said first opening, means for passing an electrical current through said semiconductor region of said layer of material in a direction transverse to an axis extending between said first and second conductive regions, a first electrode formed on said upper surface of said semiconductor region of said layer of material whereby at times said electrical current passes in said semiconductor region of said layer of material, the voltage between said first and second conductive regions is proportional to the magnitude of the magnetic field B passing orthogonal to said electrical current and to said axis extending between said first and second conductive regions and the voltage between one of said first and second conductive regions and said first electrode is proportional to the magnitude of the magnetic field B passing orthogonal to said electrical current and to the axis extending between said one of said first and second conductive regions and said first electrode;

and a signal processor circuit electrically coupled to said head for arithmetically processing said signals and for generating output signals indicative of said stored data.

20. An apparatus for forming magnetic images from a specimen comprising:

a plurality of magnetic field sensors positioned on a substrate for generating signals indicative of magnetic fields and a signal processor circuit electrically coupled to each of said plurality of magnetic field sensors for arithmetically processing said signals and for generating output signals indicative of an image, each said magnetic field sensor including a detector for sensing a magnetic field in two directions concurrently comprising:

a semi-insulating substrate of a first semiconductor material having an upper surface, first and second spaced apart conductive regions formed in said upper surface of said semi-insulating substrate, a layer of insulation formed on said upper surface of said semi-insulating substrate, said layer of insulation having a first opening therein between and above a portion of said first and second spaced apart conductive regions and exposing said upper surface of said semi-insulating substrate between said first and second conductive regions, a layer of material having an upper and lower surface having a semiconductor region and a semi-insulating region, said lower surface formed on said layer of insulation and in said first opening wherein said layer of material is said semi-insulating region on said layer of insulation and wherein said layer of material is said semiconductor region in and over said first opening, means for passing an electrical current through said semiconductor region of said layer of material in a direction transverse to an axis extending between said first and second conductive regions, a first electrode formed on said upper surface of said semiconductor region of said layer of material whereby at times said electrical current passes in said semiconductor region of said layer of material, the voltage between said first and second conductive regions is proportional to the magnitude of the magnetic field B passing orthogonal to said electrical current and to said axis extending between said first and second conductive regions and the voltage between one of said first and second conductive regions and said first electrode is proportional to the magnitude of the magnetic field B passing orthogonal to said electrical current and to the axis extending between said one of said first and second conductive regions and said first electrode.

21. The apparatus of claim 20 further including a display coupled to said signal processor circuit.

22. The apparatus of claim 20 further including means for generating a magnetic field in said specimen.

* * * * *